United States Patent [19]

Liu et al.

[11] Patent Number: 5,170,233
[45] Date of Patent: Dec. 8, 1992

[54] METHOD FOR INCREASING CAPACITIVE SURFACE AREA OF A CONDUCTIVE MATERIAL IN SEMICONDUCTOR PROCESSING AND STACKED MEMORY CELL CAPACITOR

[75] Inventors: Yauh-Ching Liu; Pierre C. Fazan; Hiang C. Chan; Charles H. Dennison; Howard E. Rhodes, all of Boise, Id.

[73] Assignee: Micron Technology, Inc., Boise, Id.

[21] Appl. No.: 722,854

[22] Filed: Jun. 27, 1991

Related U.S. Application Data

[63] Continuation-in-part of Ser. No. 672,211, Mar. 19, 1991, abandoned.

[51] Int. Cl.⁵ .............................. H01L 29/68
[52] U.S. Cl. ................... 257/308; 361/311; 361/312; 361/313; 365/149; 437/30; 437/41; 437/52; 437/60; 257/309
[58] Field of Search ............... 357/23.6, 23.4; 361/313, 312, 311; 365/149; 437/30, 41, 52, 60, 47

[56] References Cited

U.S. PATENT DOCUMENTS

| | | | |
|---|---|---|---|
| 4,981,810 | 1/1991 | Fazan et al. | 357/23.6 |
| 5,006,481 | 4/1991 | Chan et al. | 357/23.6 |
| 5,061,650 | 10/1991 | Dennison et al. | 357/23.6 |
| 5,081,559 | 1/1992 | Fazan et al. | 357/23.6 |

OTHER PUBLICATIONS

Fazan, et al., "Thin Nitride Films on Textured Polysilicon to Increase Multimegabit DRAM Cell Charge Capacity", IEEE Electron Device Letter, vol. 11, No. 7, Jul. 1990.

T. Mine, et al., "Capacitance-Enhanced Stacked-Capacitor with Engraved Storage Electrode for Deep Submicron DRAMs", Extended Abstracts of the 21st Conference on Solid State Devices and Materials, Tokyo, 1989, pp. 137-140.

H. Watanbe, et al., "A New Stacked Capacitor Structure Using Hemispherical-Grain (HSG) Poly-Silicon Electrodes", Extended Abstracts of the 22nd (1990 International) Conf. on Solid State Devices & Materials, Sendai, 1990, pp. 873-876.

Hayashide, et al., "Fabrication of Storage Capacitance-Enhanced Capacitors with a Rough Electrode", Extended Abstracts of the 22nd (1990 International) Conf. on Solid State Devices & Materials, Sendai, 1990, pp. 869-872.

Primary Examiner—Georgia Y. Epps
Attorney, Agent, or Firm—Wells, St. John, Roberts, Gregory & Matkin

[57] ABSTRACT

A method of fabricating a semiconductor wafer comprises providing an electrically conductive area on a semiconductor wafer. Multiple alternating layers of first and second materials are provided atop the wafer. The first and second materials need be selectively etchable relative to one another. The multiple layers are etched and the electrically conductive area upwardly exposed to define exposed edges of the multiple layers projecting upwardly from the electrically conductive area. One of the first or second materials is selectively isotropically etched relative to the other to produce indentations which extend generally laterally into the exposed edges of the multiple layers. A layer of electrically conductive material is applied atop the wafer and electrically conductive area, and fills the exposed edge indentations. The electrically conductive material is etched to leave conductive material extending upwardly from the electrically conductive area adjacent the multiple layer edges and within the indentations. The multiple layers are etched from the wafer to leave upwardly projecting conductive material having lateral projections extending therefrom. Such material is used to form the lower plate of a capacitor.

29 Claims, 18 Drawing Sheets

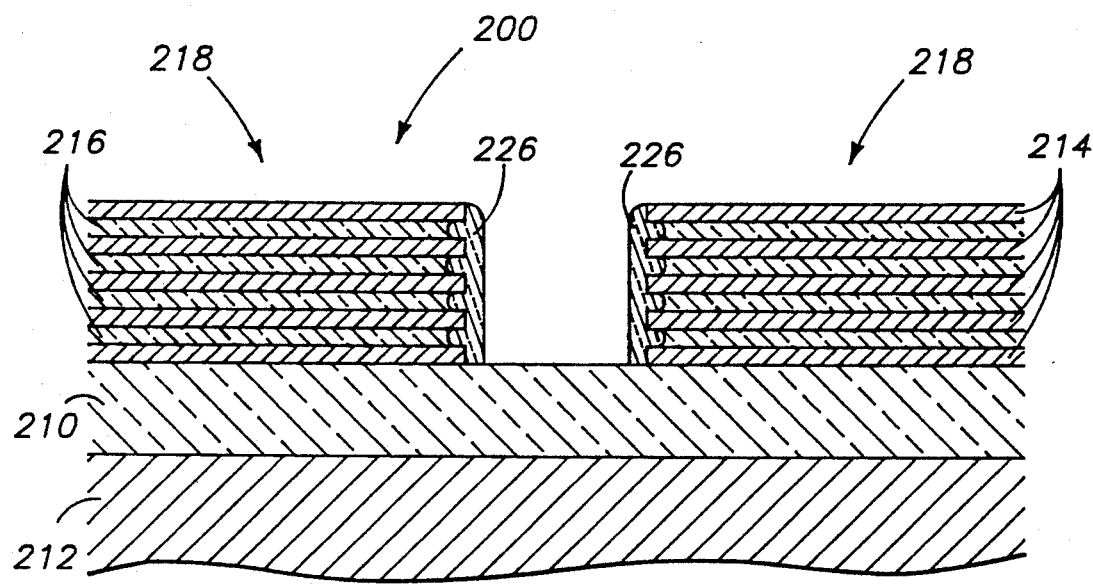
_Fig 5A_
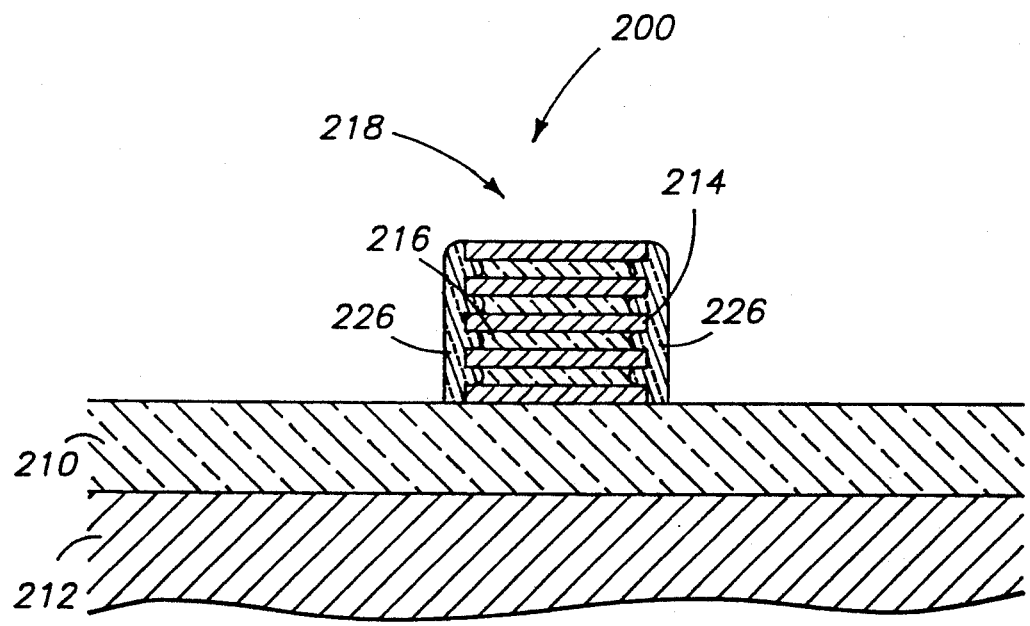
_Fig 5B_

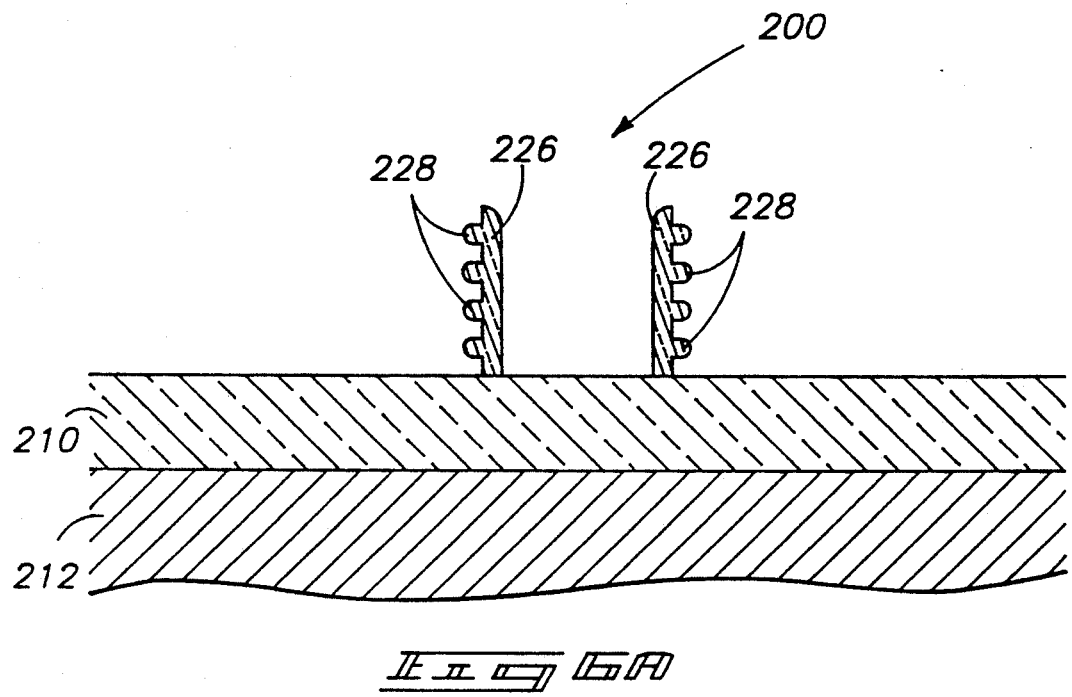
_Fig 6A_
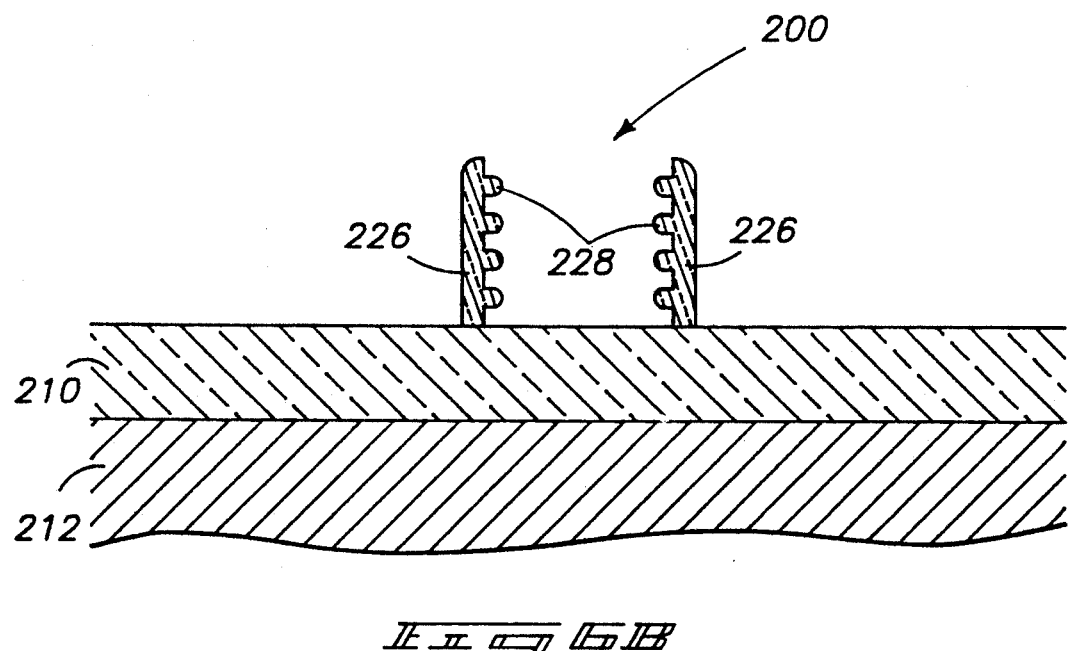
_Fig 6B_

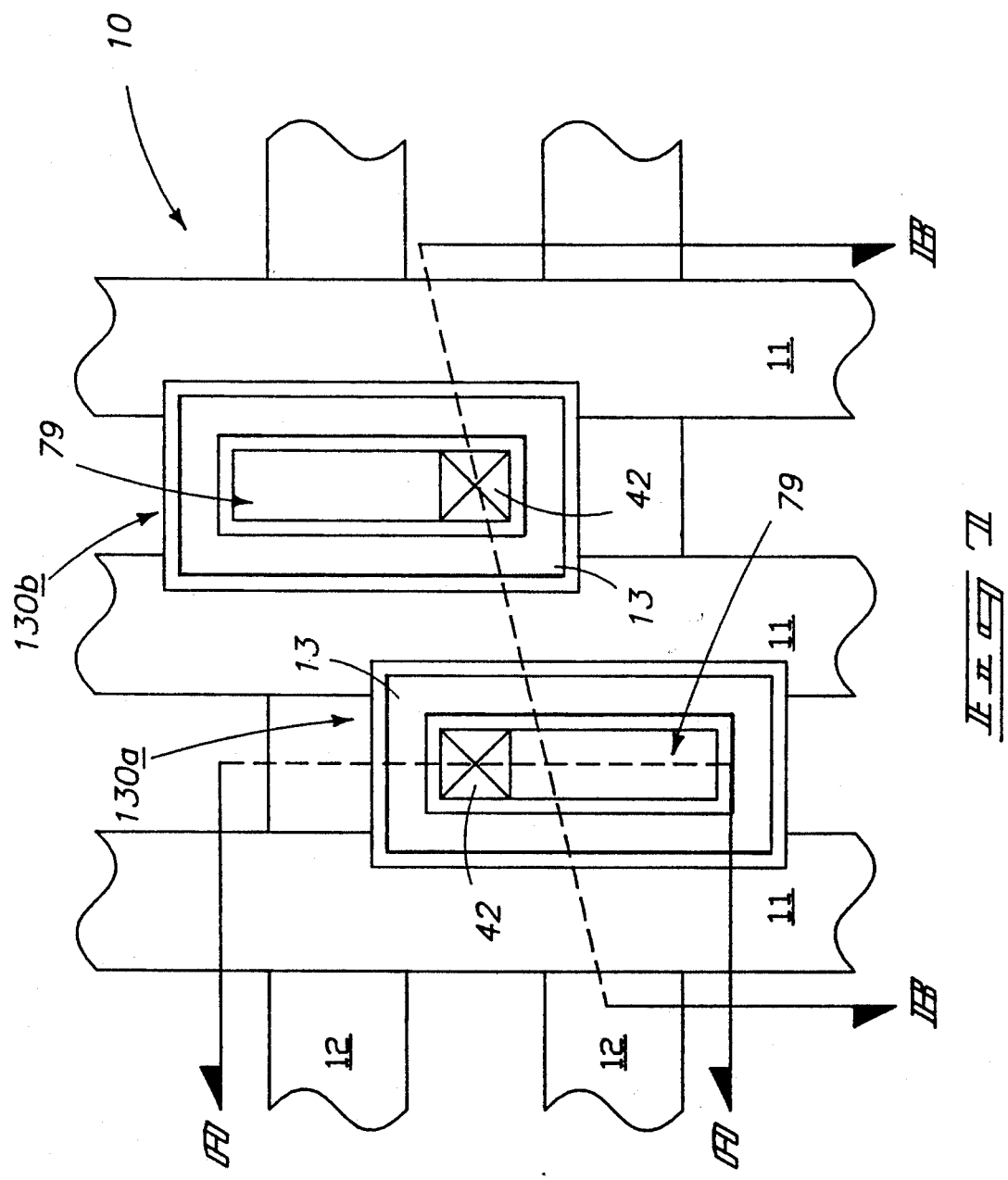

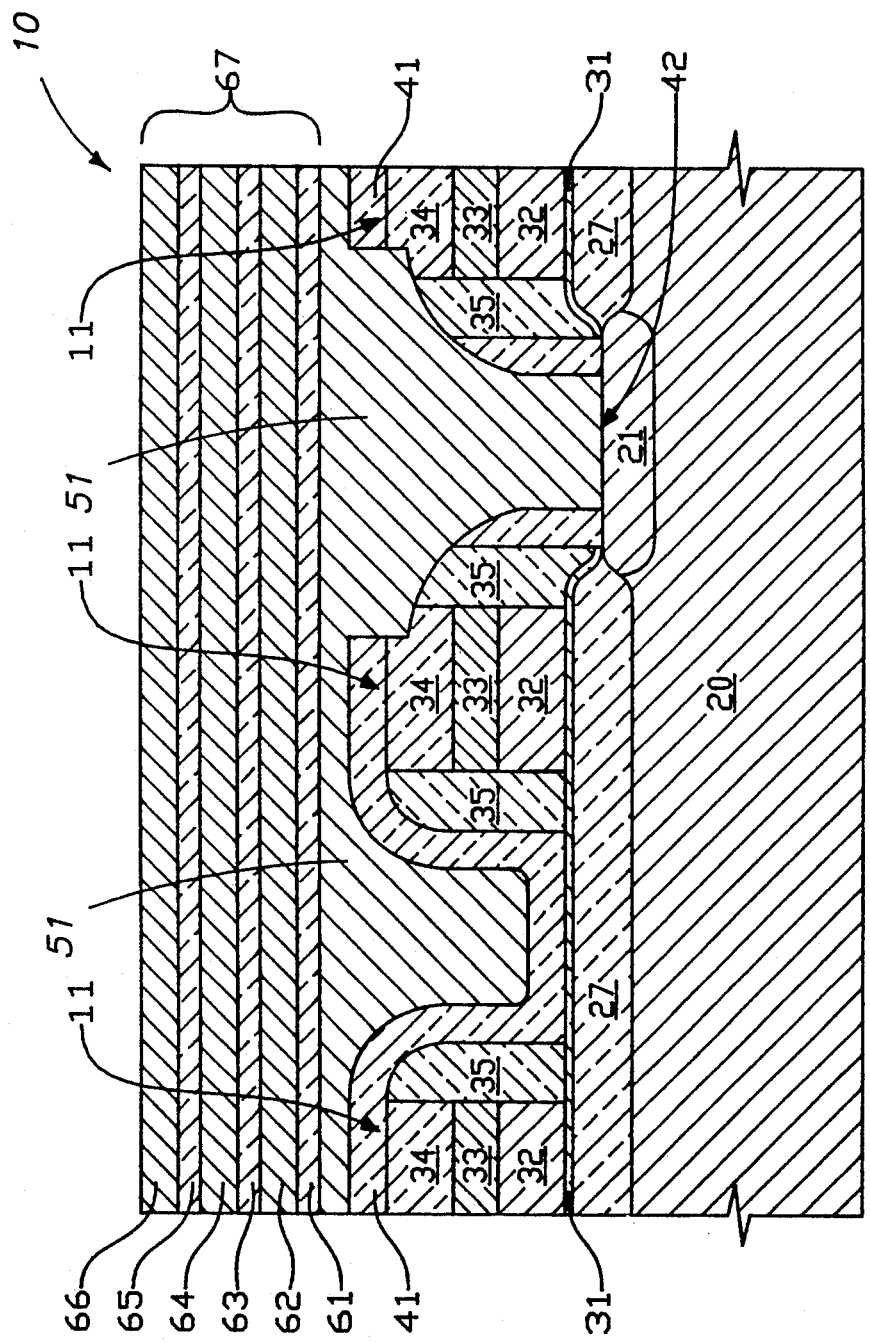

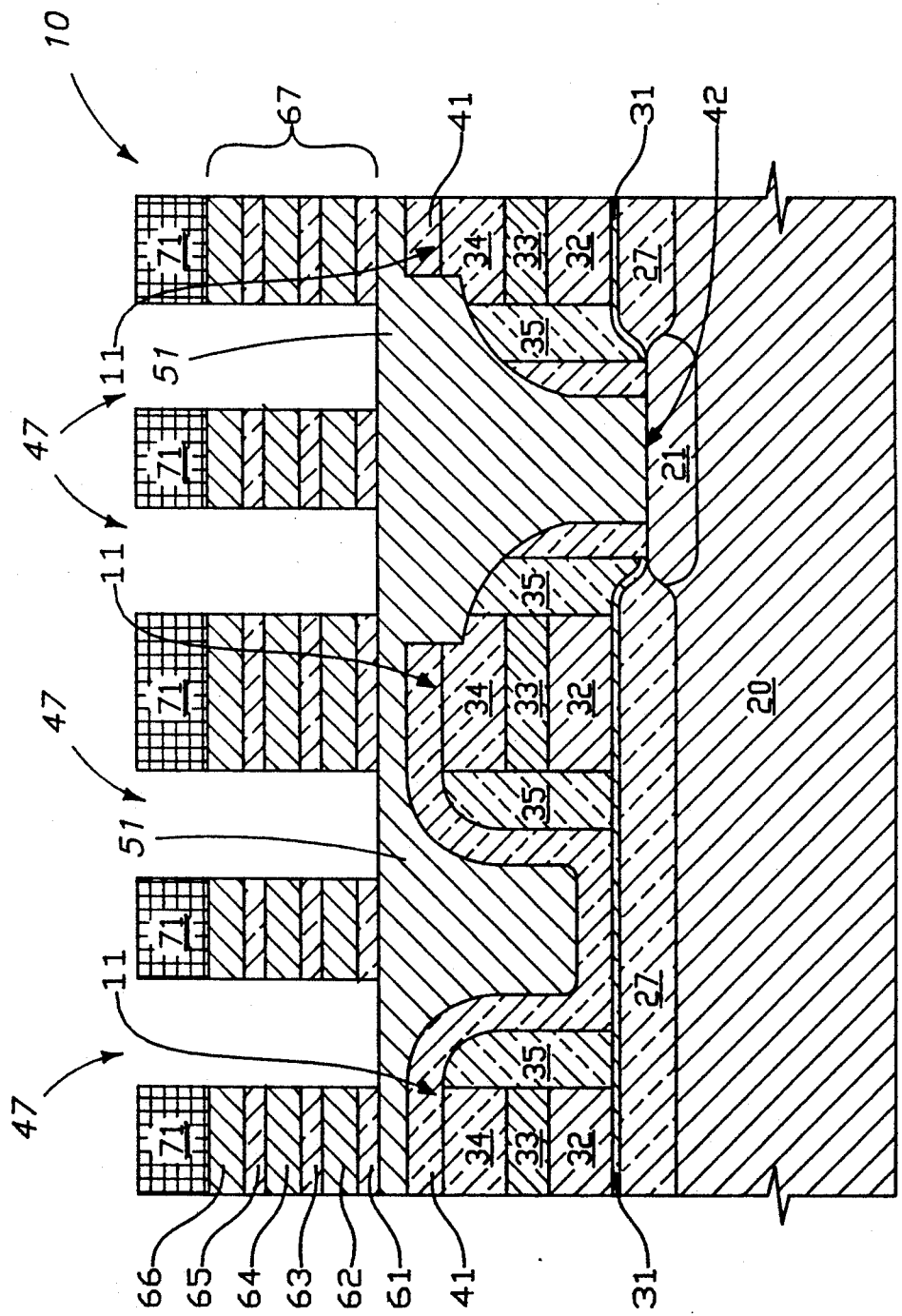

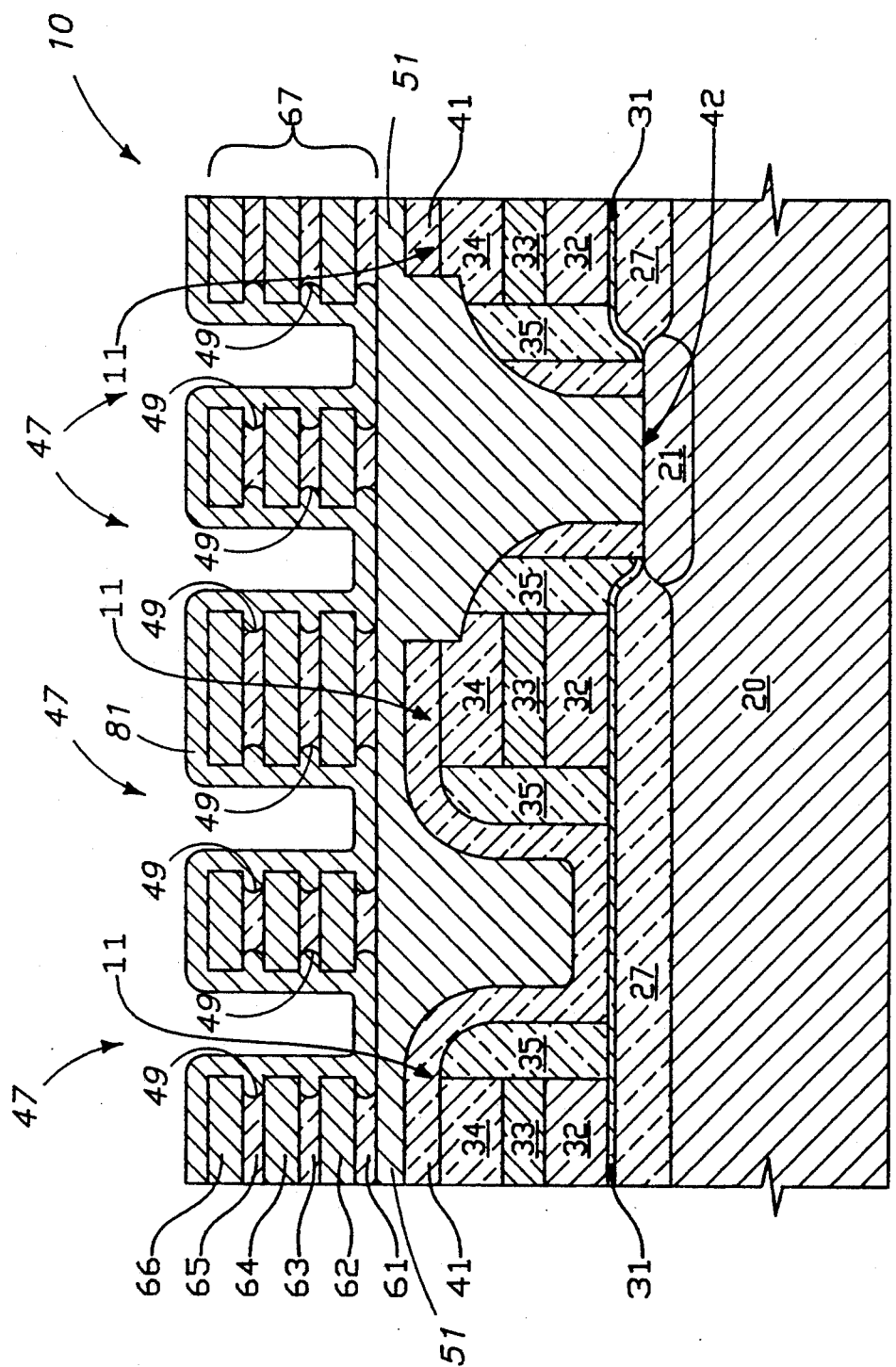

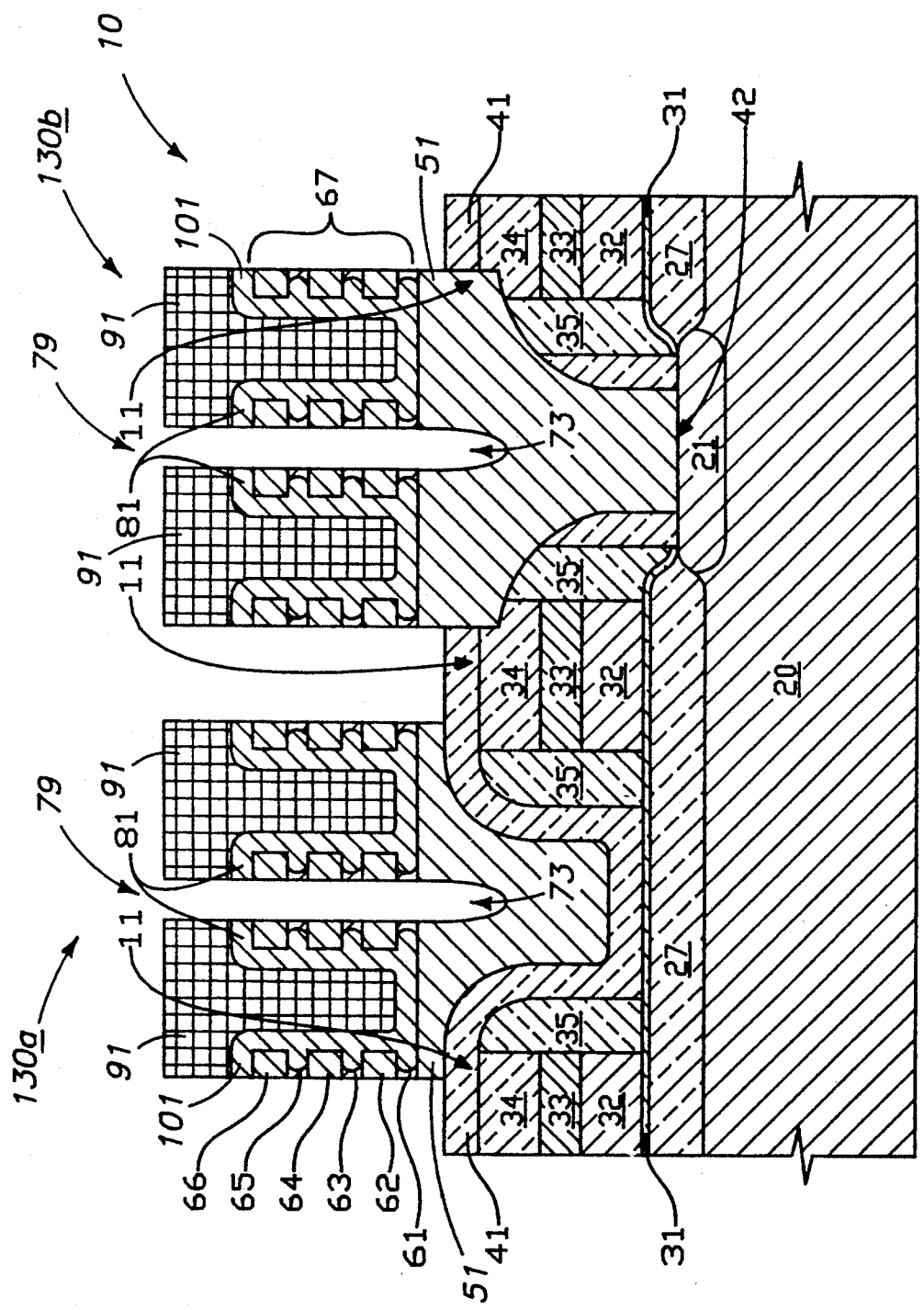

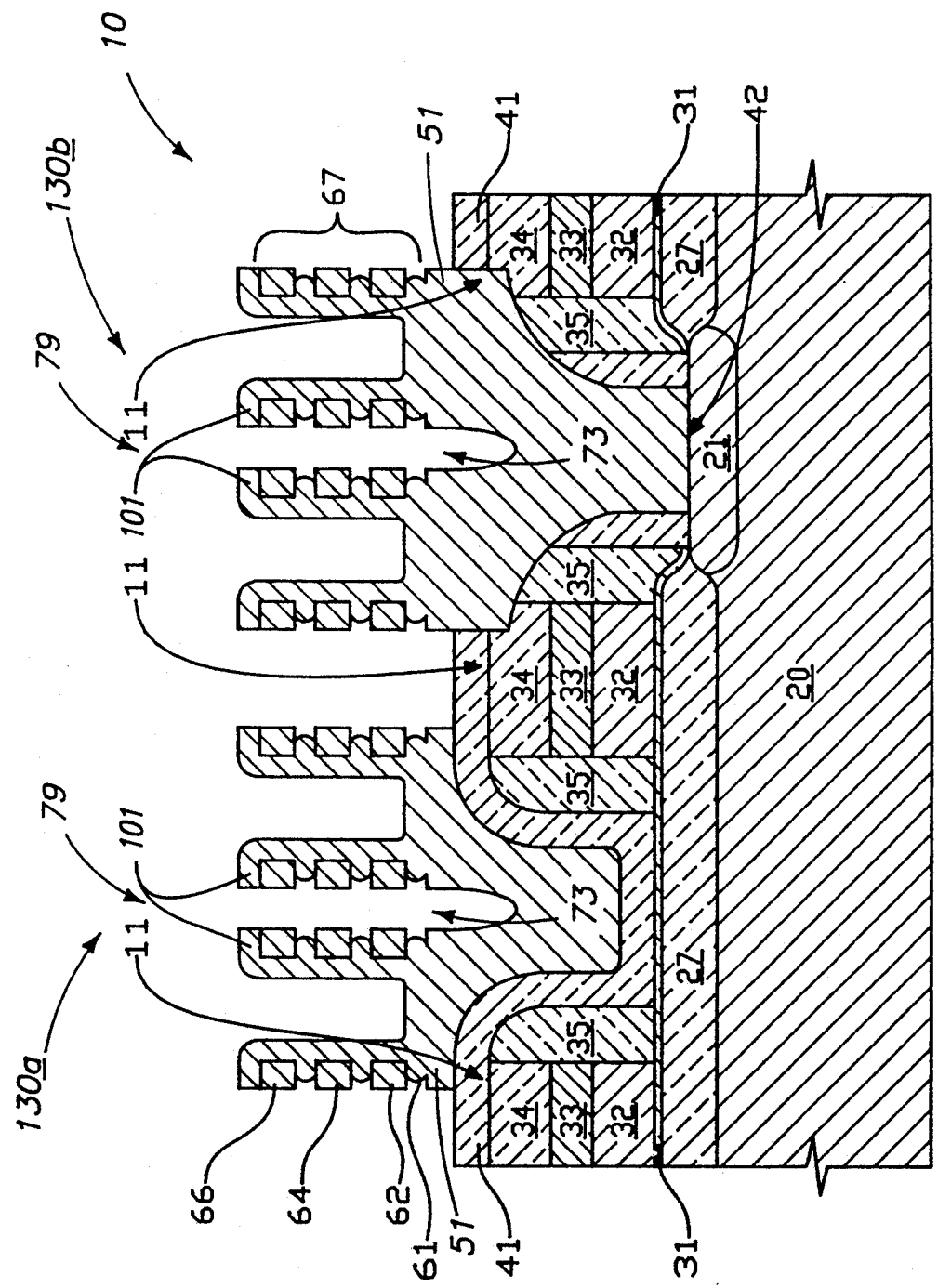

METHOD FOR INCREASING CAPACITIVE SURFACE AREA OF A CONDUCTIVE MATERIAL IN SEMICONDUCTOR PROCESSING AND STACKED MEMORY CELL CAPACITOR

RELATED PATENT APPLICATION DATA

This patent resulted from a continuation-in-part application of U.S. Pat. application Ser. No. 07/672,211, filed on Mar. 19, 1991 and entitled "Double Helix Stacked Cell Capacitor", which was abandoned.

TECHNICAL FIELD

This invention relates generally to methods for fabricating semiconductor wafers, and more particularly to three dimensional stacked capacitors and the fabrication thereof.

BACKGROUND OF THE INVENTION

As DRAMs increase in memory cell density, there is a continuous challenge to maintain a sufficiently high storage capacitance despite decreasing cell area. It is important that storage node capacitor cell plates be large enough to retain an adequate charge or capacitance in spite of parasitic capacitances and noise which may be present during circuit operation. The principal way of increasing cell density is through cell structure techniques. Such techniques include three dimensional cell capacitors, such as trenched or stacked capacitors.

One way of increasing capacitance is to roughen various surfaces of the capacitor, thereby maximizing the area for stored capacitance. Such techniques are shown by way of example in T. Mine et al., "Capacitance-Enhanced Stacked-Capacitor with Engraved Storage Electrode for Deep Submicron DRAMs", taken from Extended Abstracts of the 21st Conference on Solid State Devices and Materials, Tokyo, pp. 137–140, 1989; H. Watanabe et al., "A New stacked Capacitor Structure Using Hemispherical-Grain (HSG) Poly-Silicon Electrodes", taken from Extended Abstracts of the 22nd (1990 International) Conference on Solid State Devices and Materials, Sendai, pp. 873–876, 1990;p Hayashide et al., "Fabrication of Storage Capacitance-Enhanced Capacitors with a Rough Electrode" taken from Extended Abstracts of the 22nd (1990 International) Conference on Solid State devices and Materials, Sendai, pp. 869–872; and Fazan et al., "Thin Nitride Films on Textured Polysilicon to Increase Multimegabit DRAM Cell Charge Capacity", taken from IEEE Electron Device Letters, Vol. 11, No. 7, Jul. 7, 1990. No admission is made as to whether each of these documents is prior art to this submission.

With a conventional stacked capacitor, the capacitor is formed immediately above and electrically connected to the active device area of the associated MOS transistor of the memory cell. Typically, only the upper surface of the lower storage polysilicon node of the capacitor is utilized for capacitance. However, some attempts have been made to provide constructions to increase capacitance, whereby the back side of one capacitor terminal is used to store a charge. Such is shown by way of example by T. Ema et al., "The Numeral 3-Dimensional Stacked Capacitor Cell for 16M and 64M DRAMS" IEDM Tech. Digest, pp. 592–595, 1988 and S. Inoue et al., "A spread stacked capacitor (SSC) cell for 64M bit DRAMS", IEDM Tech. Digest, pp. 31–34, 1989.

The article by Ema et al. discloses a construction for 16 and 64 megabit DRAMS. FIGS. 1 and 11 from this article illustrate a vertically rising capacitor construction having a plurality of horizontal fins, both sides of which are utilized for stored capacitance. The article to Inoue et al. utilizes spread of horizontal area for three dimensional stacked capacitor construction. Both such processes significantly add tedious processing steps over conventional techniques for creation of three dimensional stacked cell capacitors, and require that tight tolerances be adhered to in contact alignment.

It would be desirable to improve upon these and other processes in providing three dimensional stacked capacitors which maximize capacitance.

BRIEF DESCRIPTION OF THE DRAWINGS

Preferred embodiments of the invention are described below in conjunction with the accompanying drawings, which are briefly described below.

FIG. 5A is a diagrammatic section of a substrate wafer at a processing step subsequent to that illustrated by FIG. 4B using a processing method in accordance with the invention.

FIG. 5B is a diagrammatic section of a substrate wafer at a processing step subsequent to that illustrated by FIG. 4B using a processing method in accordance with the invention.

FIG. 6A is a diagrammatic section of a substrate wafer at a processing step subsequent to that illustrated by FIG. 5A using a processing method in accordance with the invention.

FIG. 6B is a diagrammatic section of a substrate wafer at a processing step subsequent to that illustrated by FIG. 5B using a processing method in accordance with the invention.

FIG. 7 is a top plan view of a portion of a semiconductor wafer illustrating digit lines, word lines and a lower storage capacitor plate produced by a process in accordance with the invention.

FIG. 12 is a diagrammatic section as would be taken through line B—B of FIG. 7 at a processing step subsequent to that illustrated by FIG. 11 in accordance with the invention.

FIG. 13 is a diagrammatic section as would be taken through line B—B of FIG. 7 at a processing step subsequent to that illustrated by FIG. 12 in accordance with the invention.

FIG. 14 is a diagrammatic section as would be taken through line B—B of FIG. 7 at a processing step subsequent to that illustrated by FIG. 13 in accordance with the invention.

FIG. 15 is a diagrammatic section as would be taken through line B—B of FIG. 7 at a processing step subsequent to that illustrated by FIG. 14 in accordance with the invention.

FIG. 16 is a diagrammatic section as would be taken through line B—B of FIG. 7 at a processing step subsequent to that illustrated by FIG. 15 in accordance with the invention.

FIG. 17 is a diagrammatic section as would be taken through line B—B of FIG. 7 at a processing step subsequent to that illustrated by FIG. 16 in accordance with the invention.

DETAILED DESCRIPTION OF THE PREFERRED EMBODIMENTS

Figure 1:
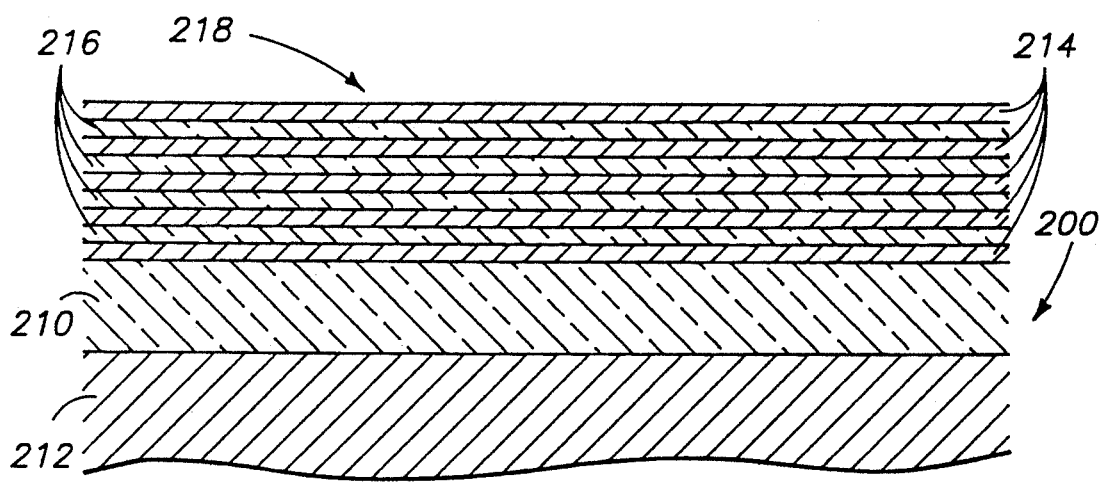
FIG. 1 is a diagrammatic section view of a portion of a semiconductor wafer at one processing step of a processing method in accordance with the invention.

This disclosure of the invention is submitted in furtherance of the constitutional purposes of the U.S. Patent Laws "to promote the progress of science and useful arts" (Article 1, Section 8).

In accordance with the invention, a method of fabricating a semiconductor wafer comprises:

providing an electrically conductive area on a semiconductor wafer;

providing multiple alternating layers of first and second materials atop the wafer, the first and second materials being selectively etchable relative to one another;

etching the multiple layers and upwardly exposing the electrically conductive area, to define exposed edges of the multiple layers projecting upwardly from the electrically conductive area;

selectively isotropically etching one of the first or second materials relative to the other of the first and second materials to produce indentations which extend generally laterally into the exposed edges of the multiple layers;

applying a layer of electrically conductive material atop the wafer and electrically conductive area, and filling the exposed edge indentations with such electrically conductive material;

etching the electrically conductive material to leave conductive material extending upwardly from the electrically conductive area adjacent the multiple layer edges and within the indentations; and etching the multiple layers from the wafer to leave upwardly projecting conductive material having lateral projections extending therefrom.

In accordance with another aspect of the invention, a storage capacitor formed within a silicon substrate comprises:

an electrically conductive lower storage plate comprising a plurality of upwardly projecting concentric rings having projections extending laterally therefrom;

an electrically conductive upper storage plate; and a dielectric layer interposed between the upper and lower storage plates.

In accordance with yet another aspect of the invention, a method of fabricating an array of DRAM storage capacitors on a silicon wafer having active area, word lines and digit lines comprises:

applying a dielectric layer atop the wafer;

patterning and etching the dielectric layer to upwardly expose selected active area;

applying a first electrically conductive layer atop the wafer, the first electrically conductive layer contacting the selected active areas;

planarizing the first electrically conductive layer;

providing multiple alternating layers of first and second materials atop the wafer over the planarized first electrically conductive layer, the first and second materials being selectively etchable relative to one another;

patterning and etching the multiple layers to expose selected portions of the planarized first electrically conductive layer and define exposed edges of the multiple layers which project upwardly from the selected first electrically conductive layer portions;

selectively isotropically etching one of the first or second materials relative to the other of the first and second materials to produce indentations which extend generally laterally into the exposed edges of the multiple layers;

applying a second layer of electrically conductive material atop the wafer and selected first electrically conductive layer portions, and filling the exposed edge indentations with electrically conductive material;

patterning and etching the first and second conductive layers t define individual electrically isolated lower capacitor cell plates having portions which project upwardly adjacent the multiple layer edges and within the indentations;

etching the multiple layers from the wafer to leave upwardly projecting conductive material having lateral projections extending therefrom;

applying a capacitor dielectric layer atop the wafer over the upwardly projecting conductive material; and applying a third conductive layer atop the wafer over the capacitor dielectric layer to define an upper capacitor plate.

More specifically and first with reference to FIGS. 1-6B, a semiconductor wafer is diagrammatically illustrated with numeral 200. Wafer 200 is diagrammatically illustrated as having a polysilicon layer 210 applied over a base substrate 212, with polysilicon layer 210 providing an electrically conductive area to which an electrically conductive material will be connected. Multiple alternating layers 214, 216 of first and second materials respectively, are applied atop polysilicon layer 210. Overall, layers 24 and 26 produce a combined or composite layer 218. The materials of layers 214 and 216 need be selectively etchable relative to one another. Example materials would be nitrides and oxides, such as silicon dioxide or silicon nitride. For example, silicon nitride is selectively etchable relative to silicon dioxide by using a hot, wet $H_3PO_4$ etch. Also by way of example, silicon dioxide is selectively etchable relative to nitride material by use of a wet buffered HF etching solution. Other etching techniques for selectively etching oxides or nitrides relative to one another, or use of other materials, could of course be used as are known by people of skill in the art.

Layers 214 and 216 are preferably applied to a thickness of from 200 Angstroms to 1000 Angstroms, with about 500 Angstroms being most preferred. Such can be applied by, by way of example only, low pressure chemical vapor deposition (LPCVD) or plasma enhanced chemical vapor deposition (PECVD) techniques. For example, when silicon dioxide ($SiO_2$) is being applied, it is typically done by injecting a combination of $SiH_4$ and $O_2$. Silico nitride ($Si_3N_4$) is typically formed by injecting $SiH_4$ and $NH_3$. By alternating the feeds of $NH_3$ and $O_2$ with a constant feed of $SiH_4$, successive layers can be formed as illustrated.

The discussion proceeds with reference to FIGS. 2A, 2B, 3A, 3B, 4A, 4B, 5A, 5B, 6A and 6B. The "A" series of figures illustrate "hole" patterning, while the "B" series of figures illustrate "island" patterning.

Figure 2A:
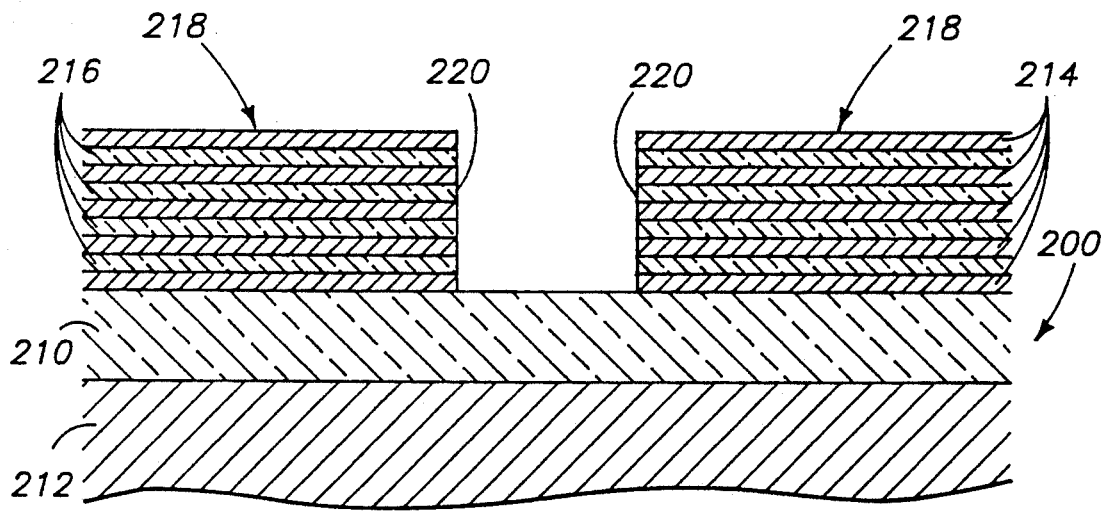
FIG. 2A is a diagrammatic section of a substrate wafer at a processing step subsequent to that illustrated by FIG. 1 using a processing method in accordance with the invention.
Figure 2B:
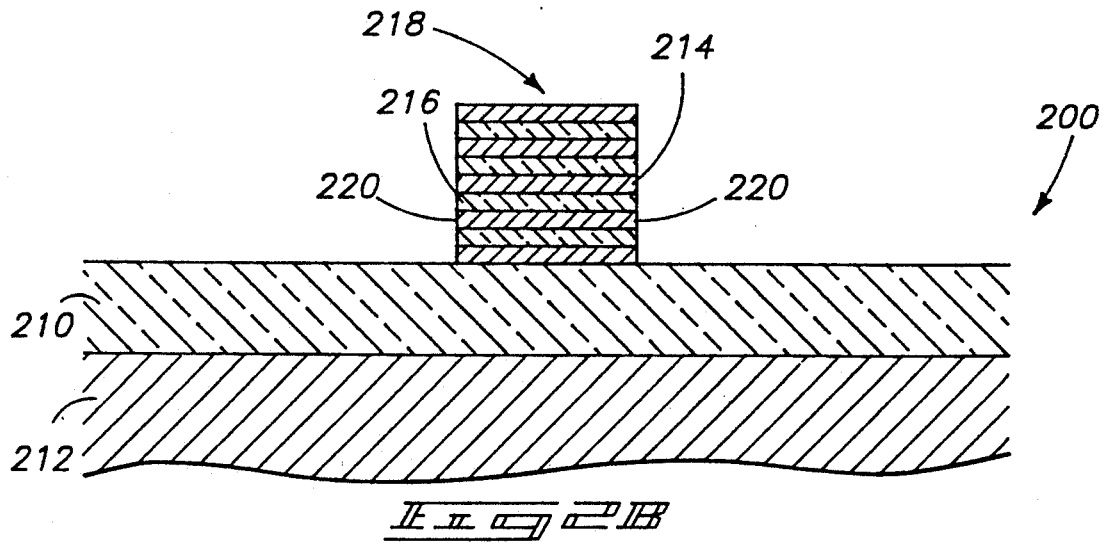
FIG. 2B is a diagrammatic section of a substrate wafer at a processing step subsequent to that illustrated by FIG. 1 using a processing method in accordance with the invention.

Referring to FIGS. 2A and 2B, multiple layer composite 218 is etched down to poly layer 210 to define exposed edges 220 of composite 218 which project upwardly from poly layer 210. In this manner, the multiple layer composite 218 is etched to upwardly expose an electrically conductive area in the form of now exposed poly layer 210. It would also of course be possible to provide an opening to the bulk substrate, followed by doping thereof to produce an electrically conductive active area exposed through the opening. Where the selectively etchable materials are an oxide or nitride, such layers could be removed by separate etching steps which selectively are etchable relative to each, or by chemistry which will etch both. For example, a mixture of $CF_4$ and $CHF_3$ will anisotropically etch oxide and nitride, as is well known to people of skill in the art.

Figure 3A:
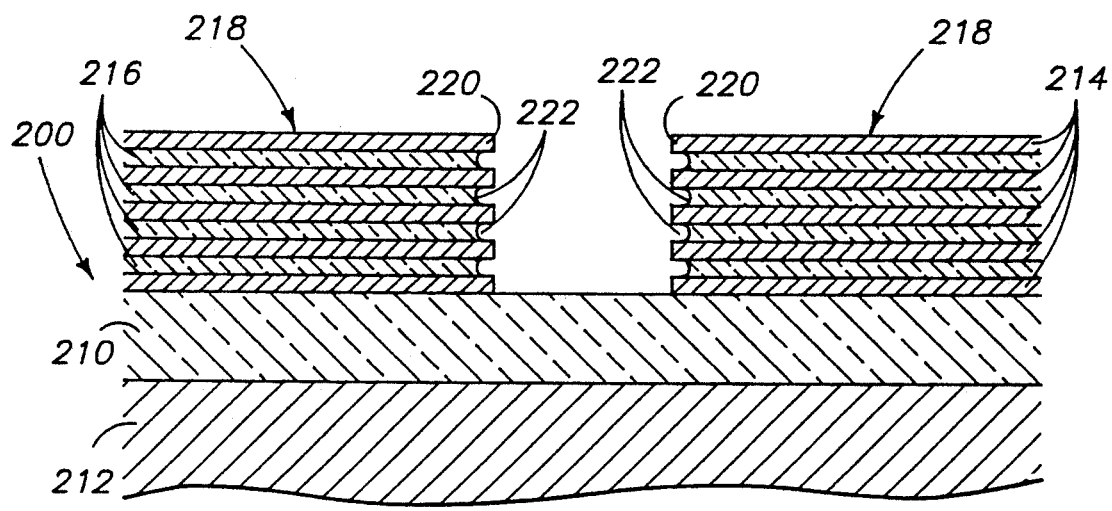
FIG. 3A is a diagrammatic section of a substrate wafer at a processing step subsequent to that illustrated by FIG. 2A using a processing method in accordance with the invention.
Figure 3B:
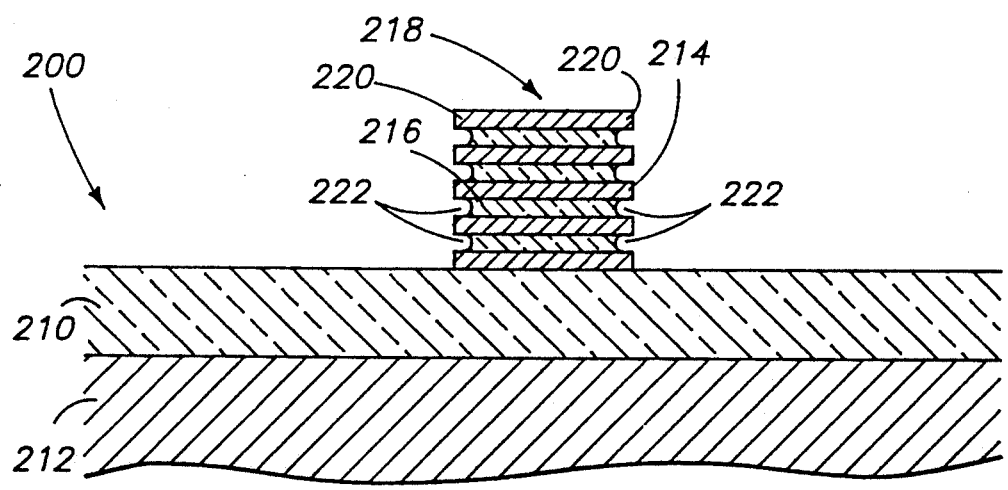
FIG. 3B is a diagrammatic section of a substrate wafer at a processing step subsequent to that illustrated by FIG. 2B using a processing method in accordance with the invention.
Figure 4A:
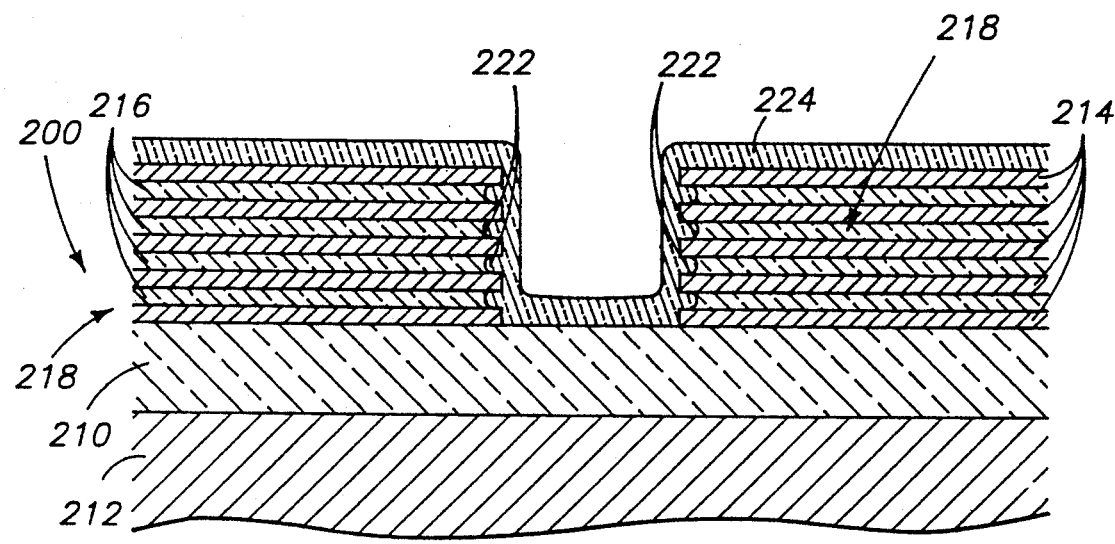
FIG. 4A is a diagrammatic section of a substrate wafer at a processing step subsequent to that illustrated by FIG. 3A using a processing method in accordance with the invention.
Figure 4B:
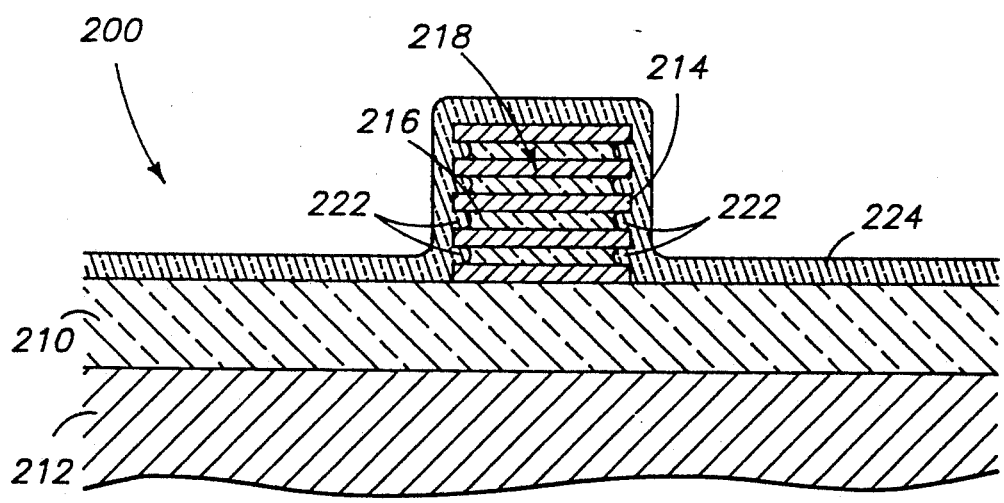
FIG. 4B is a diagrammatic section of a substrate wafer at a processing step subsequent to that illustrated by FIG. 3B using a processing method in accordance with the invention.

Referring to FIGS. 3A and 3B, one of the first or second materials is selectively isotropically etched relative to the other to produce indentations 222 which extend generally laterally into the exposed edges 220 of multiple layer composite 218. In the depicted embodiment, oxide layers 216 are indicated as having been selectively etched relative to nitride layers 214. A time controlled etch is conducted to preferably produce indentations which are from 500 Angstroms to 1000 Angstroms in length. Referring to FIGS. 4A and 4B, a layer of electrically conductive material 224 is provided atop the wafer and the exposed electrically conductive area of poly layer 210, and fills exposed edge indentations 222. Such electrically conductive material is preferably conductively doped polysilicon. The preferred thickness of layer 224 is from 500 Angstroms to about 1500 Angstroms.

Referring to FIGS. 5A and 5B, conductive layer 24 is etched, such as by an anisotropic etch, to leave conductive material extending upwardly from poly layer 210 adjacent multiple layer composite edges 220 and within indentations 222, and thereby define conductive upward projections 226.

Referring to FIGS. 6A and 6B, remaining portions of multiple layer composite 218 are etched from the wafer to leave stand alone upward projections 226 having lateral projections 228 extending therefrom. A thin dielectric could thereafter be applied, followed by another conductive layer to form a capacitor. Capacitance of projections 226 is maximized in part by lateral projections 228. Projections 226 could be course be texturized, by techniques well known in the art, to further increase capacitance.

FIGS. 7-19 depict a portion of a wafer during various processing steps in forming DRAM circuitry. FIG. 7 is a top planar view of a wafer 10 having digit lines 11, word line 12 and capacitors 130a and 130b. Capacitors 130a and 130b connect with active device areas of FET transistors at buried capacitor contacts 42.

Figure 8:
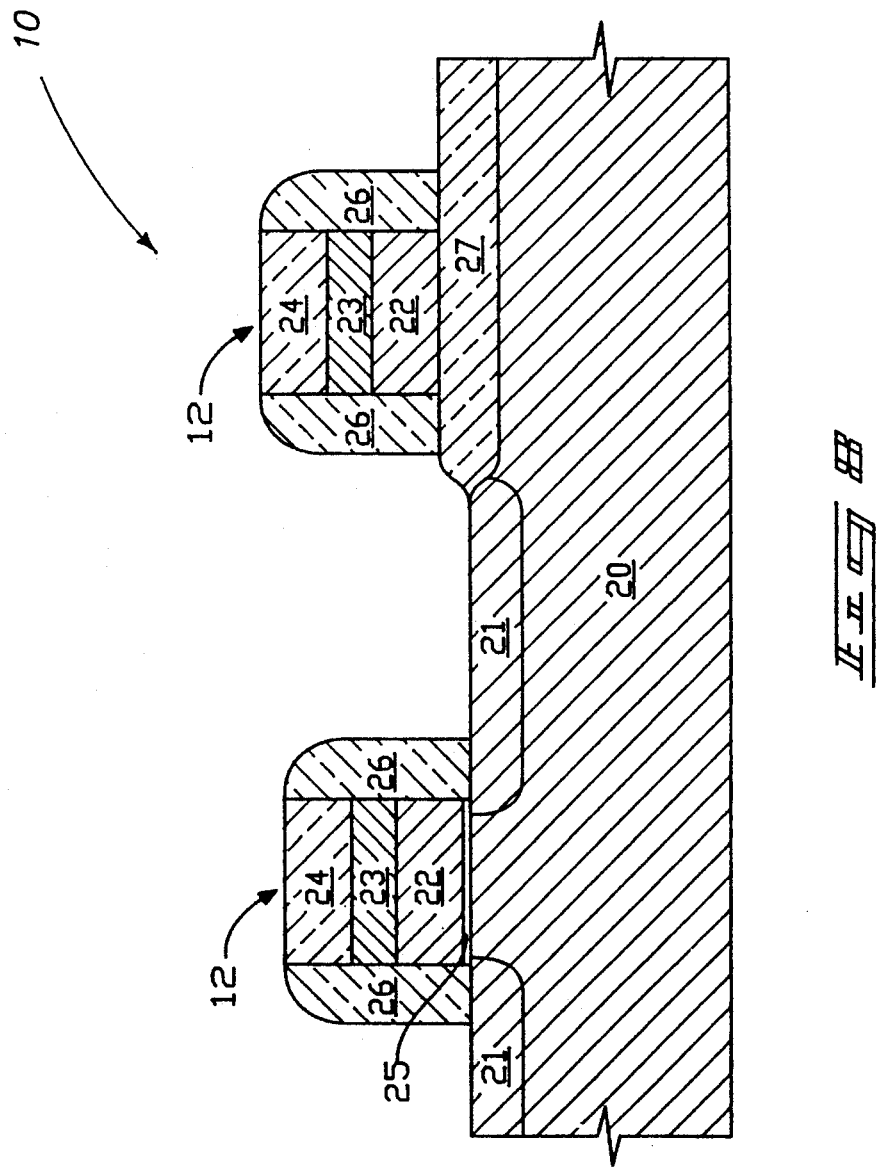
FIG. 8 is a diagrammatic section as would be taken through line A—A of FIG. 7 at one step in a processing method in accordance with the invention.

FIG. 8 illustrates word lines 12 as comprising gate oxide layer 25, polysilicon 22, a covering silicide layer 23, and covering dielectric layer 24 (either oxide or nitride). Word lines 12 are further isolated from one another and subsequent conductive layers by dielectric spacers 26 (also either oxide or nitride). Field oxide 27 and doped active transistor areas 21 have been provided as indicated.

Figure 9:
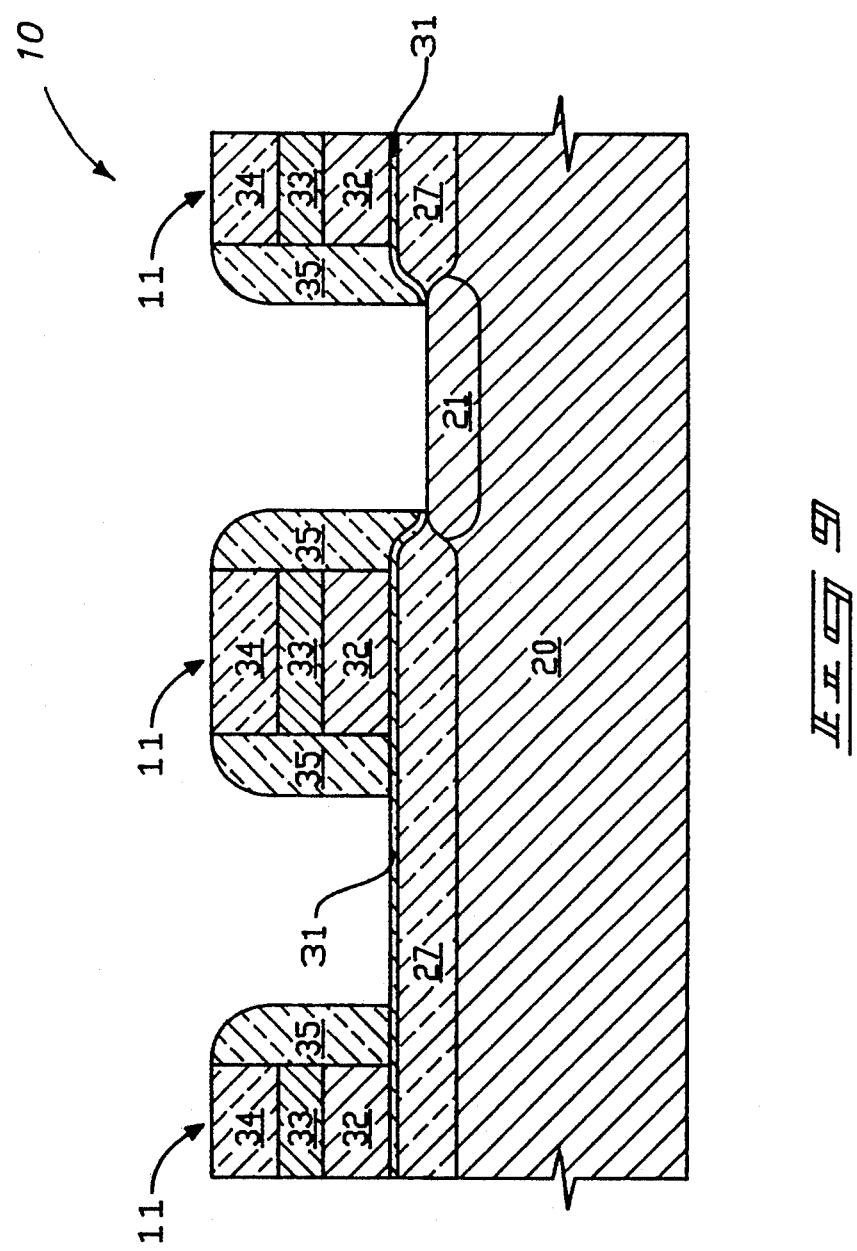
FIG. 9 is a diagrammatic section as would be taken through line B—B of FIG. 7 at one step in a processing method in accordance with the invention.

FIG. 9 illustrates formation of digit lines 11. A conformal layer of dielectric 31 is deposited over the existing wafer surface to isolate previously formed active areas 21 from the subsequent formation of digit lines 11. Digit lines 11 are comprised of patterned layers comprising polysilicon 32, silicide 33 and dielectric 34. Dielectric 34 can be either nitride or oxide and is deposited by chemical vapor deposition (CVD) which is preferred for its excellent conformity. Polysilicon 32 has previously been conductively doped to electrically couple with silicide 33 to serve as the conductor for digit lines 11, as is well known to people of skill in the art. Digit lines 11 run perpendicular to and over the top of word lines 12 (FIG. 8) and conform to the wafer surface resulting in a waveform-like topology running in both the digit line and word line directions. A second dielectric, such as nitride or oxide is now deposited, followed by an anisotropic etch to form vertical dielectric spacers 35.

Figure 10:
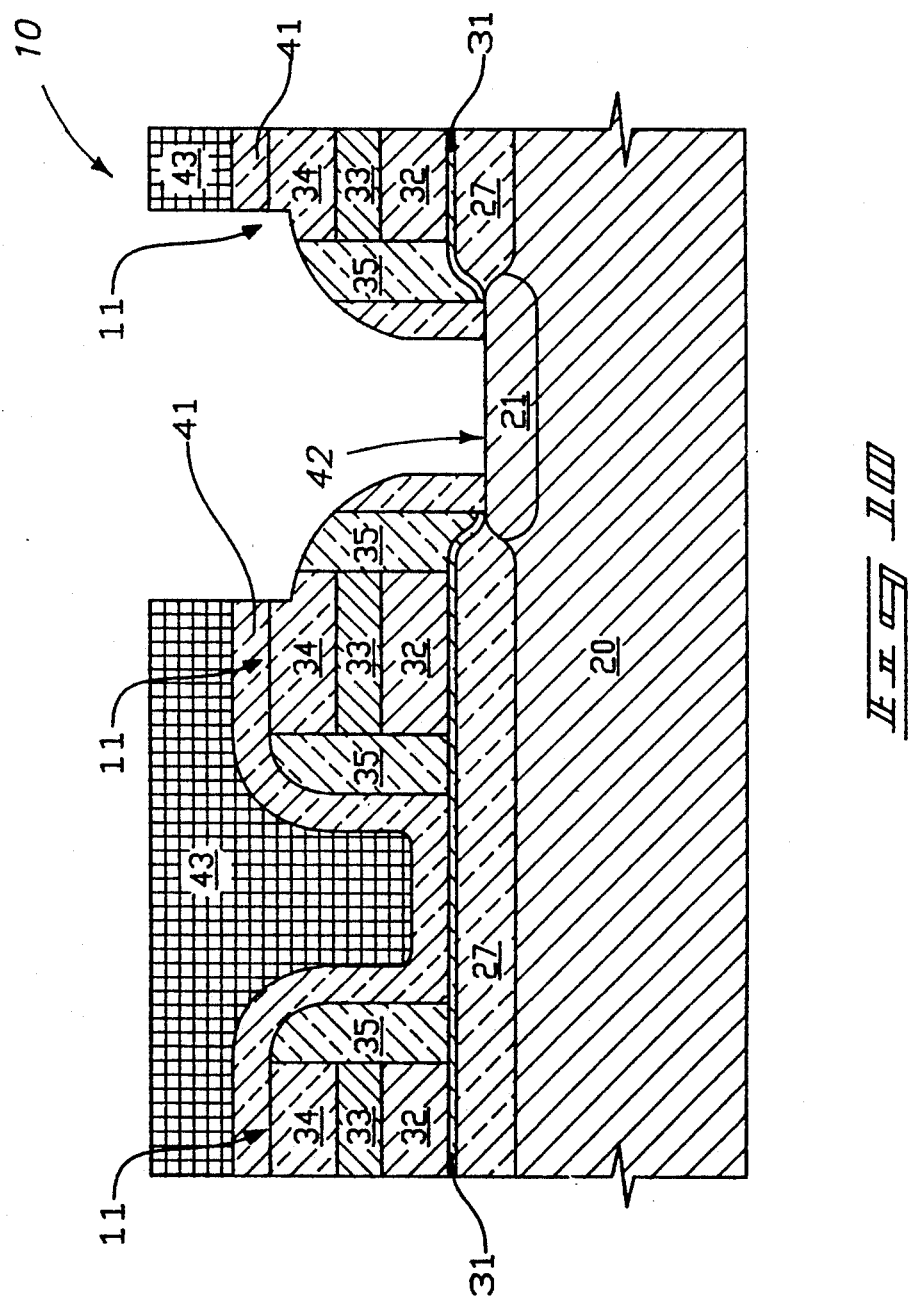
FIG. 10 is a diagrammatic section as would be taken through line B—B of FIG. 7 at a processing step subsequent to that illustrated by FIG. 9 in accordance with the invention.

As shown in FIG. 10, digit lines 11 and their subsequent isolation layers are then covered with dielectric 41 to a preferred thickness of 500 to 2000 angstroms, preferably by CVD. Dielectric 41 may also be either nitride or oxide depending on the desired use outlined in the following process. Following dielectric 41 deposition, photoresist 43 is applied and masked to enable opening and defining of buried contacts 42. After applying an appropriate photomask, a buried contact anisotropic etch provides an opening to locate contact 42.

Up to this point, process flow has followed that of an array comprising conventional stacked capacitor cells. From this point forward, the process is unique to an array having storage capacitors in accordance with the invention.

Figure 11:
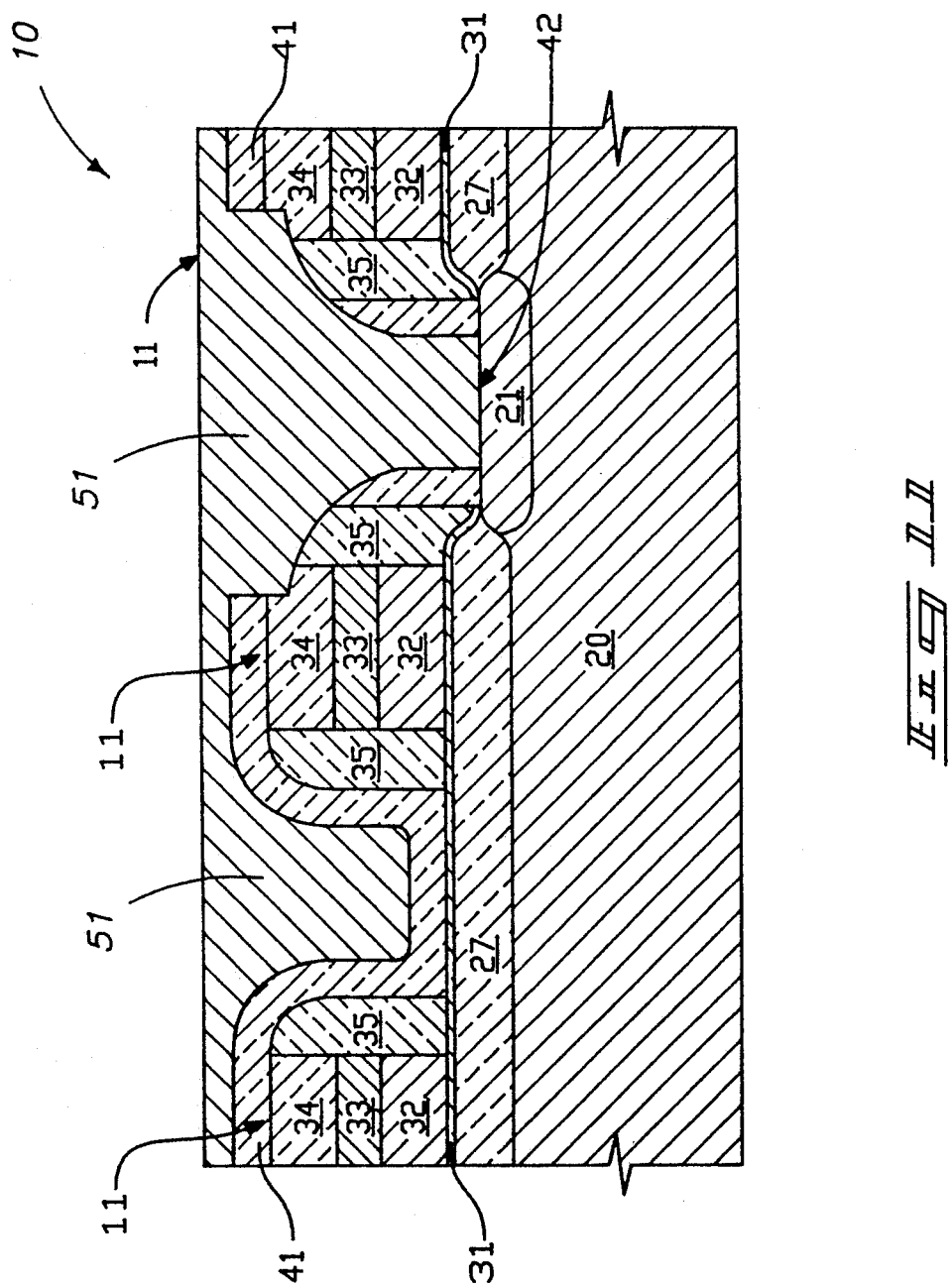
FIG. 11 is a diagrammatic section as would be taken through line B—B of FIG. 7 at a processing step subsequent to that illustrated by FIG. 10 in accordance with the invention.
Figure 11:
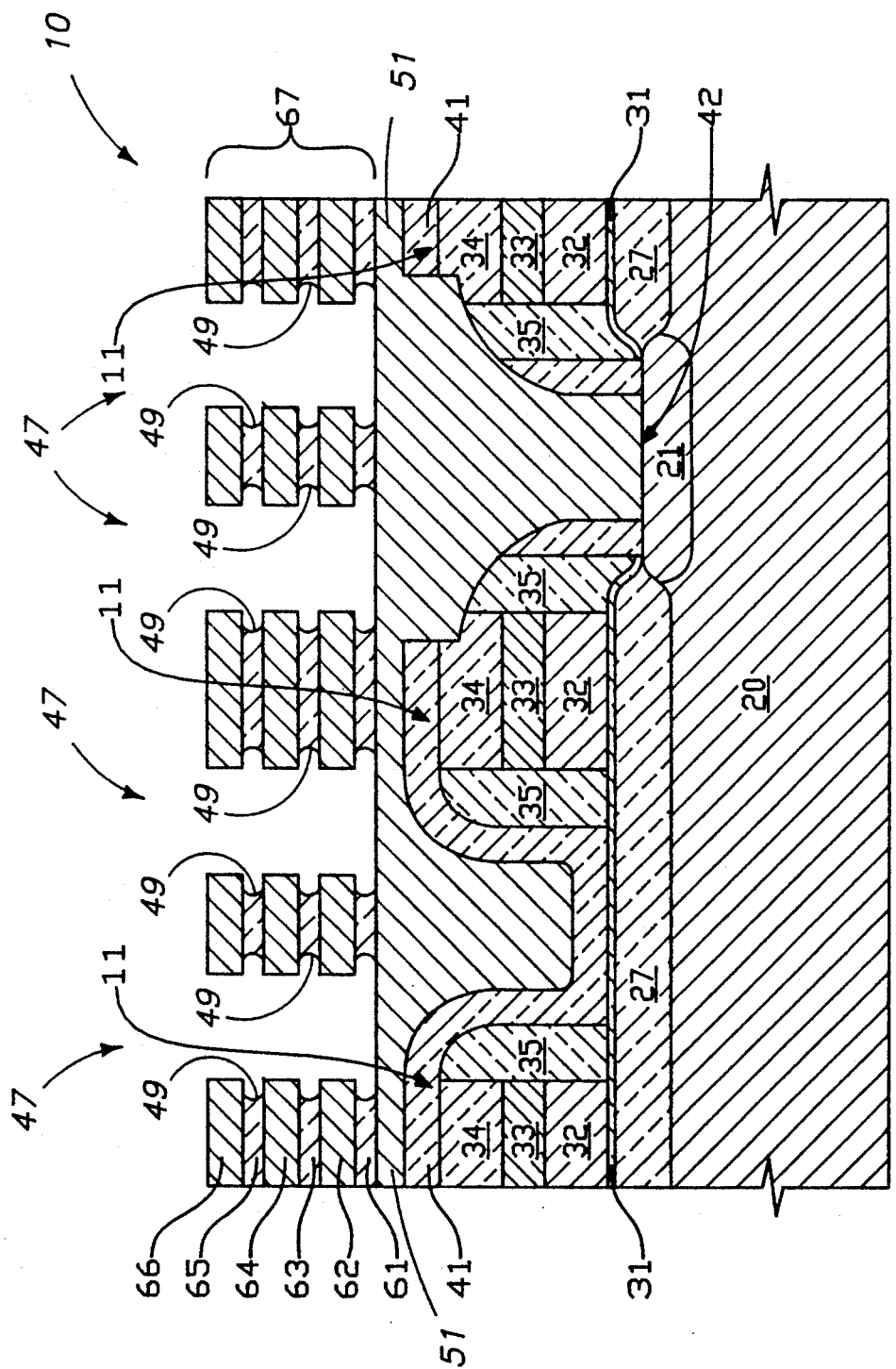

As shown in FIG. 11, the photoresist 43 (of FIG. 10) has been stripped and a thick layer of conformal conductively doped polysilicon layer 51 has been deposited and planarized. Conformal poly layer 51 connects to active areas 21 via bared contacts 42.

As shown in FIG. 12, multiple alternating layers 61, 62, 63, 64, 65 and 66 of first and second materials are applied atop planarized polysilicon 51, forming a composite or combined layer 67. As described above, the first and second materials need be selectively etchable relative to one another, and preferably comprise oxide and nitride. Layer 61 could be oxide followed by dielectric 62 being nitride, and this pattern repeated for dielectrics 63 through 66. The order of the layering is not important as long as the pattern has largely alternating types of materials which are selectively etchable relative to one another.

As shown in FIG. 13, a layer of photoresist 71 is applied and patterned and a subsequent etch conducted to open holes 47 in composite layer 67, with the etch stopping at poly layer 51. Photoresist 71 is then cleared.

As shown in FIG. 14, a timed controlled etch is performed to etch away alternating edges of multiple dielectric layer 67 to form cavities therein. Specifically, layers 61, 63 and 65 are indicated as being selectively etched relative to layers 62, 64 and 66, and poly 51, to produce cavities or indentations 49. In the preferred embodiment a time controlled wet etch is performed with the specific etch used being dependent on the dielectric ordering of multiple dielectric layer 67. For example, oxide and nitride are selectively etchable relative to one another, and poly, as is well known to people of skill in the art, and is briefly described above.

As shown in FIG. 15, a conformal layer of poly 81 is deposited after formation of cavities 49, thus filling in such cavities and making contact to planarized poly layer 51. In order to make the process steps clearer to follow, hereinafter the layering of multiple dielectric 67 consists of first dielectric 61 being oxide, second dielectric 62 being nitride, with this pattern repeating itself through dielectric 66.

As illustrated by FIG. 16, a layer of photoresist 91 is applied atop poly layer 81 and patterned as indicated. A subsequent etch is conducted to form a dielectric structure consisting of etched poly 81 interconnected with poly 51 and remaining portions of composite layer 67. Also during this etch, an inner portion 79 (FIGS. 7 and 16) is removed down into planarized poly 51 and to clear planarized poly 51, which is not covered by resist 91, to form electrically isolated individual storage node capacitor plates 101 and thereby begin definition of isolated capacitor structures 130a and 130b. Plates 101 will comprise the lower capacitor plates. During this etch, trenches 73 are formed in poly 51 as shown. The actual patterning of photoresist 91 can be somewhat misaligned as the removal of the inner portion will still create inner edges with patterned poly 81 always making contact to planarized poly 51.

As shown in FIG. 17, photo resist 91 has been removed and a wet oxide etch performed to clear residual oxide 61, 63 and 65 (FIG. 16) remaining on the edges of patterned poly 81. This leaves nitride portions 62, 64 and 66 as shown.

Figure 18:
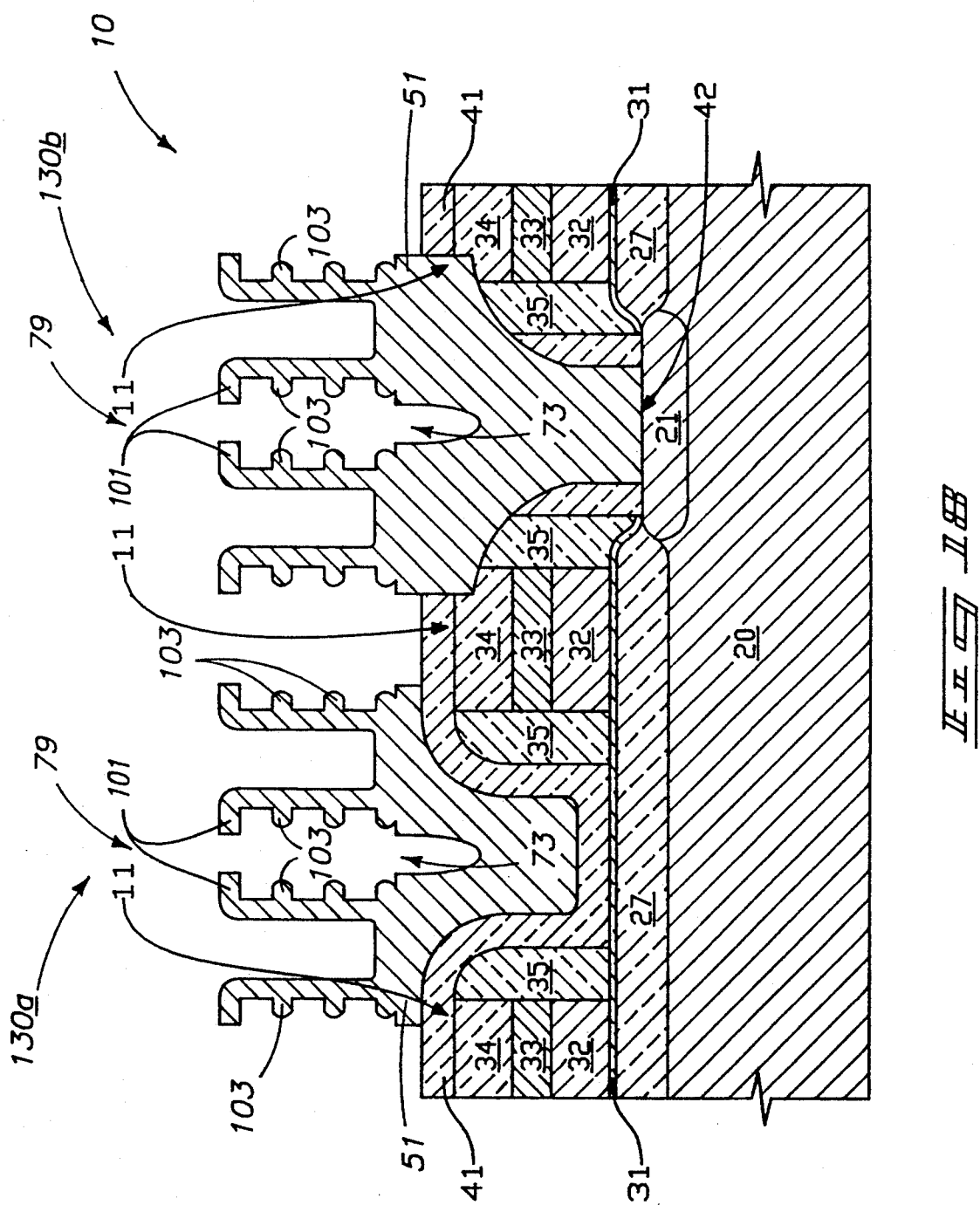
FIG. 18 is a diagrammatic section as would be taken through line B—B of FIG. 7 at a processing step subsequent to that illustrated by FIG. 17 in accordance with the invention.

As shown in FIG. 18, a wet nitride etch is performed to clear the nitride residing in the cavities of storage node plate 101. This leaves upwardly projecting conductive material having lateral projections 103 extending therefrom. The upwardly projecting portions are presented into the shape of a pair of concentric rings as viewed from the top (FIG. 7) having lateral projections 103 (FIG. 18) for each electrically isolated lower capacitor plate 101. The upwardly projecting portions extend to the lower trenched polysilicon portion 51 that electrically connects to active area 21 via buried contact 42. The polysilicon making up storage node plate 101 could of course be texturized by conventional texturization techniques, known to one skilled in the art, during various process steps to further increase the storage node plate'surface area.

Figure 19:
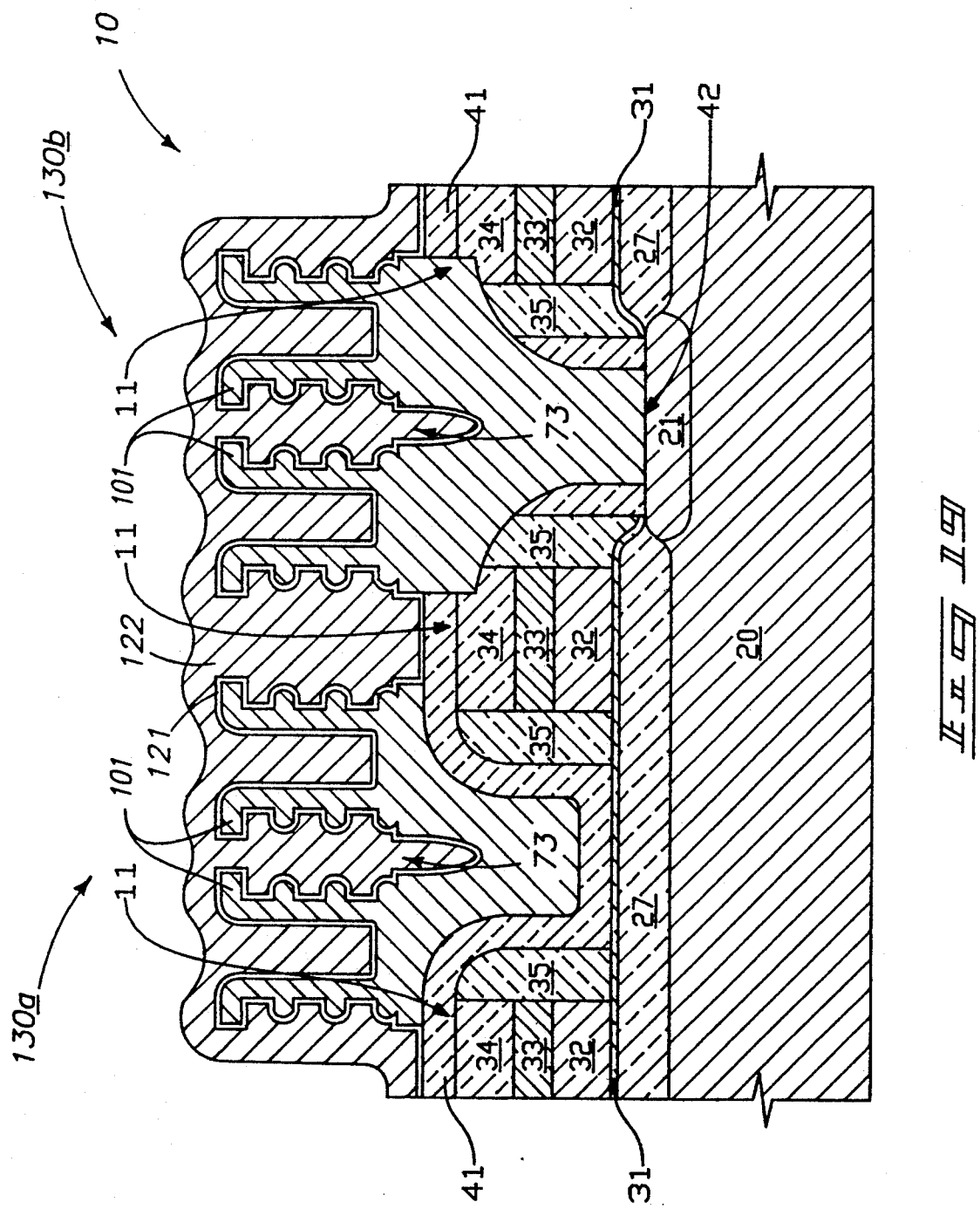
FIG. 19 is a diagrammatic section as would be taken through line B—B of FIG. 7 at a processing step subsequent to that illustrated by FIG. 18 in accordance with the invention.

Referring to FIG. 19, a conventional capacitor dielectric 121 is deposited atop the wafer over lower plates 101. Dielectric 121 can be comprised of materials having a high dielectric constant such as nitride, an oxide-nitride compound or $Ta_2O_5$. Following cell dielectric 121 deposition, a blanket deposition of conformal poly 122 is deposited. Poly plates 101 and 122 are conductively doped either n-type or p-type depending on the conductivity type desired for active area 21. Poly 122 serves as a poly capacitor cell plate which becomes a common cell plate to all storage capacitors in the array.

With the 3-dimensional shape and texturized surface of poly storage node plate 101, along with poly capacitor cell plate 122 that envelopes plate 101, substantial capacitor plate surface area is gained at the storage node. Because capacitance is greatly affected by surface area of a capacitor's storage node plates, the area gained can provide an additional 200% or more increase in capacitance over that of a conventional stacked capacitor, without more space than that required for defining a stacked capacitor storage cell.

Throughout the preferred embodiment, polysilicon is deposited and conductively doped to serve as conductive lines and capacitor plates. However many materials that possess conductive qualities and that can be deposited or sputtered may be used in place of polysilicon if so desired.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of fabricating a semiconductor wafer comprising:
   providing an electrically conductive area on a semiconductor wafer;
   providing multiple alternating layers of first and second materials atop the wafer, the first and second materials being selectively etchable relative to one another;
   etching the multiple layers and upwardly exposing the electrically conductive area, to define exposed edges of the multiple layers projecting upwardly from the electrically conductive area;
   selectively isotropically etching one of the first or second materials relative to the other of the first and second materials to produce indentations which extend generally laterally into the exposed edges of the multiple layers;
   applying a layer of electrically conductive material atop the wafer and electrically conductive area, and filling the exposed edge indentations with such electrically conductive material;

etching the electrically conductive material to leave conductive material extending upwardly from the electrically conductive area adjacent the multiple layer edges and within the indentations; and etching the multiple layers from the wafer to leave upwardly projecting conductive material having conductive and exposed lateral projections extending therefrom.

2. The method of fabricating a semiconductor wafer of claim 1 wherein the first and second materials comprise an oxide and a nitride.

3. The method of fabricating a semiconductor wafer of claim 1 wherein the electrically conductive material comprises conductively doped polysilicon.

4. The method of fabricating a semiconductor wafer of claim 1 wherein the first and second materials comprise an oxide and a nitride, and the electrically conductive material comprises conductively doped polysilicon.

5. The method of fabricating a semiconductor wafer of claim 1 wherein the step of etching the electrically conductive material is conducted by an anisotropic etch.

6. The method of fabricating a semiconductor wafer of claim 1 wherein the alternating layers are each applied to a thickness of from 200 Angstroms to 1000 Angstroms.

7. The method of fabricating a semiconductor wafer of claim 1 wherein the alternating layers are each applied to a thickness of about 500 Angstroms.

8. The method of fabricating a semiconductor wafer of claim 1 wherein the first and second materials comprise an oxide and a nitride, and wherein the alternating layers are each applied to a thickness of from 200 Angstroms to 1000 Angstroms.

9. The method of fabricating a semiconductor wafer of claim 1 wherein the first and second materials comprise an oxide and a nitride, the alternating layers are each applied to a thickness of from 200 Angstroms to 1000 Angstroms, and the electrically conductive material comprises conductively doped polysilicon.

10. The method of fabricating a semiconductor wafer of claim 1 wherein the electrically conductive material is applied to a thickness of from 500 Angstroms to 1500 Angstroms.

11. The method of fabricating a semiconductor wafer of claim 1 wherein the alternating layers are each applied to a thickness of from 200 Angstroms to 1000 Angstroms, and the electrically conductive material is applied to a thickness of from 500 Angstroms to 1500 Angstroms.

12. A product produced according to the process of claim 1.

13. A method of fabricating a semiconductor wafer comprising:

providing an electrically conductive area on a semiconductor wafer;

providing multiple alternating layers of oxide and nitride materials atop the wafer to respective thicknesses of from 200 Angstroms to 1000 Angstroms, the oxide and nitride materials being selectively etchable relative to one another;

etching the multiple layers and upwardly exposing the electrically conductive area, to define exposed edges of the multiple layers projecting upwardly from the electrically conductive area;

selectively isotropically etching one of the oxide or nitride materials relative to the other of the first and second materials to produce indentations which extend generally laterally into the exposed edges of the multiple layers;

providing a layer of conductively doped polysilicon atop the wafer and electrically conductive area to a thickness of from 500 Angstroms to about 1500 Angstroms, and filling the exposed edge indentations with such polysilicon;

etching the polysilicon to leave polysilicon extending upwardly from the electrically conductive area adjacent the multiple layer edges and within the indentations; and etching the multiple layers from the wafer to leave upwardly projecting polysilicon having conductive and exposed lateral projections extending therefrom.

14. The method of fabricating a semiconductor wafer of claim 13 wherein the step of etching the electrically conductive material is conducted by an anisotropic etch.

15. A product produced according to the process of claim 13.

16. A method of fabricating an array of DRAM storage capacitors on a silicon wafer having active areas, word lines and digit lines, the method comprising:

applying a dielectric layer atop the wafer;

patterning and etching the dielectric layer to upwardly expose selected active area;

applying a first electrically conductive layer atop the wafer, the first electrically conductive layer contacting the selected active areas;

planarizing the first electrically conductive layer;

providing multiple alternating layers of first and second materials atop the wafer over the planarized first electrically conductive layer, the first and second materials being selectively etchable relative to one another;

patterning and etching the multiple layers to expose selected portions of the planarized first electrically conductive layer and define exposed edges of the multiple layers which project upwardly from the selected first electrically conductive layer portions;

selectively isotropically etching one of the first or second materials relative to the other of the first and second materials to produce indentations which extend generally laterally into the exposed edges of the multiple layers;

applying a second layer of electrically conductive material atop the wafer and selected first electrically conductive layer portions, and filling the exposed edge indentations with electrically conductive material;

patterning and etching the first and second conductive layers to define individual electrically isolated lower capacitor cell plates having portions which project upwardly adjacent the multiple layer edges and within the indentations;

etching the multiple layers from the wafer to leave upwardly projecting conductive material having lateral projections extending therefrom;

applying a capacitor dielectric layer atop the wafer over the upwardly projecting conductive material; and applying a third conductive layer atop the wafer over the capacitor dielectric layer to define an upper capacitor plate.

17. The method of fabricating a semiconductor wafer of claim 16 wherein the first and second materials comprise an oxide and a nitride.

18. The method of fabricating a semiconductor wafer of claim 16 wherein the recited electrically conductive material is everywhere conductively doped polysilicon.

19. The method of fabricating a semiconductor wafer of claim 16 wherein the first and second materials comprise an oxide and a nitride, and the recited electrically conductive material is everywhere conductively doped polysilicon.

20. A product produced according to the process of claim 16.

21. The method of fabricating a semiconductor wafer of claim 16 further comprising forming the upwardly projecting portions into the shape of a pair of concentric rings having lateral projections for each electrically isolated lower capacitor plate.

22. The method of fabricating a semiconductor wafer of claim 21 wherein the pair of concentric conductive rings are defined by an inner ring and an outer ring, the lateral projections of the inner ring being formed to project inwardly, the lateral projections of the outer ring being formed to project outwardly.

23. The method of fabricating a semiconductor wafer of claim 21 wherein the first and second materials comprise an oxide and a nitride, and the recited electrically conductive material is everywhere conductively doped polysilicon.

24. A product produced according to the process of claim 21.

25. A product produced according to the process of claim 22.

26. A storage capacitor formed within a silicon substrate comprising:
an electrically conductive lower storage plate comprising a plurality of upwardly projecting rings having projections extending laterally therefrom;
an electrically conductive upper storage plate; and
a dielectric layer interposed between the upper and lower storage plates.

27. The storage capacitor of claim 26 wherein the lower plate rings are defined by an inner ring and an outer ring, the lateral projections of the inner ring projecting inwardly, the lateral projections of the outer ring projecting outwardly.

28. The storage capacitor of claim 26 wherein the plurality of rings comprise a plurality of concentric rings.

29. The storage capacitor of claim 27 wherein the plurality of rings comprise a plurality of concentric rings.

* * * * *